United States Patent
Sasaya et al.

(10) Patent No.: US 7,778,054 B2
(45) Date of Patent: Aug. 17, 2010

(54) POWER SWITCHING CIRCUIT IMPROVED TO REDUCE LOSS DUE TO REVERSE RECOVERY CURRENT

(75) Inventors: Takanari Sasaya, Toyokawa (JP); Takeshi Inoue, Nagoya (JP); Tomonori Kimura, Oobu (JP)

(73) Assignee: Denso Corporation, Kariya (JP)

( * ) Notice: Subject to any disclaimer, the term of this patent is extended or adjusted under 35 U.S.C. 154(b) by 30 days.

(21) Appl. No.: 12/372,163

(22) Filed: Feb. 17, 2009

(65) Prior Publication Data
US 2009/0206812 A1    Aug. 20, 2009

(30) Foreign Application Priority Data
Feb. 15, 2008   (JP)   .............................. 2008-034524

(51) Int. Cl.
*H02H 7/122* (2006.01)
(52) U.S. Cl. .................. 363/56.01; 363/56.03
(58) Field of Classification Search ............. 363/56.03, 363/56.01, 147, 132
See application file for complete search history.

(56) References Cited

U.S. PATENT DOCUMENTS 4,969,081 A * 11/1990 Shekhawat et al. ........ 363/56.04

FOREIGN PATENT DOCUMENTS

| JP | 10-327585 | 12/1998 |
|---|---|---|
| JP | 2006-141167 | 6/2006 |
| JP | 2006-141168 | 6/2006 |

\* cited by examiner

*Primary Examiner*—Shawn Riley
(74) *Attorney, Agent, or Firm*—Nixon & Vanderhye PC

(57) ABSTRACT

In a power switching circuit, a second commutation member has a second commutation path electrically connected in parallel to a first commutation path and a second diode provided in the second commutation path and electrically connected antiparallel to a semiconductor switching element. While the semiconductor switching element is off, the second commutation path allows a second current based on the inductive load to flow therethrough in a forward direction of the second diode within a commutation period. The second diode has a second reverse recovery time shorter than a first reverse recovery time of the first diode. A second inductance of the second commutation path is higher than a first inductance of the first commutation path.

16 Claims, 12 Drawing Sheets

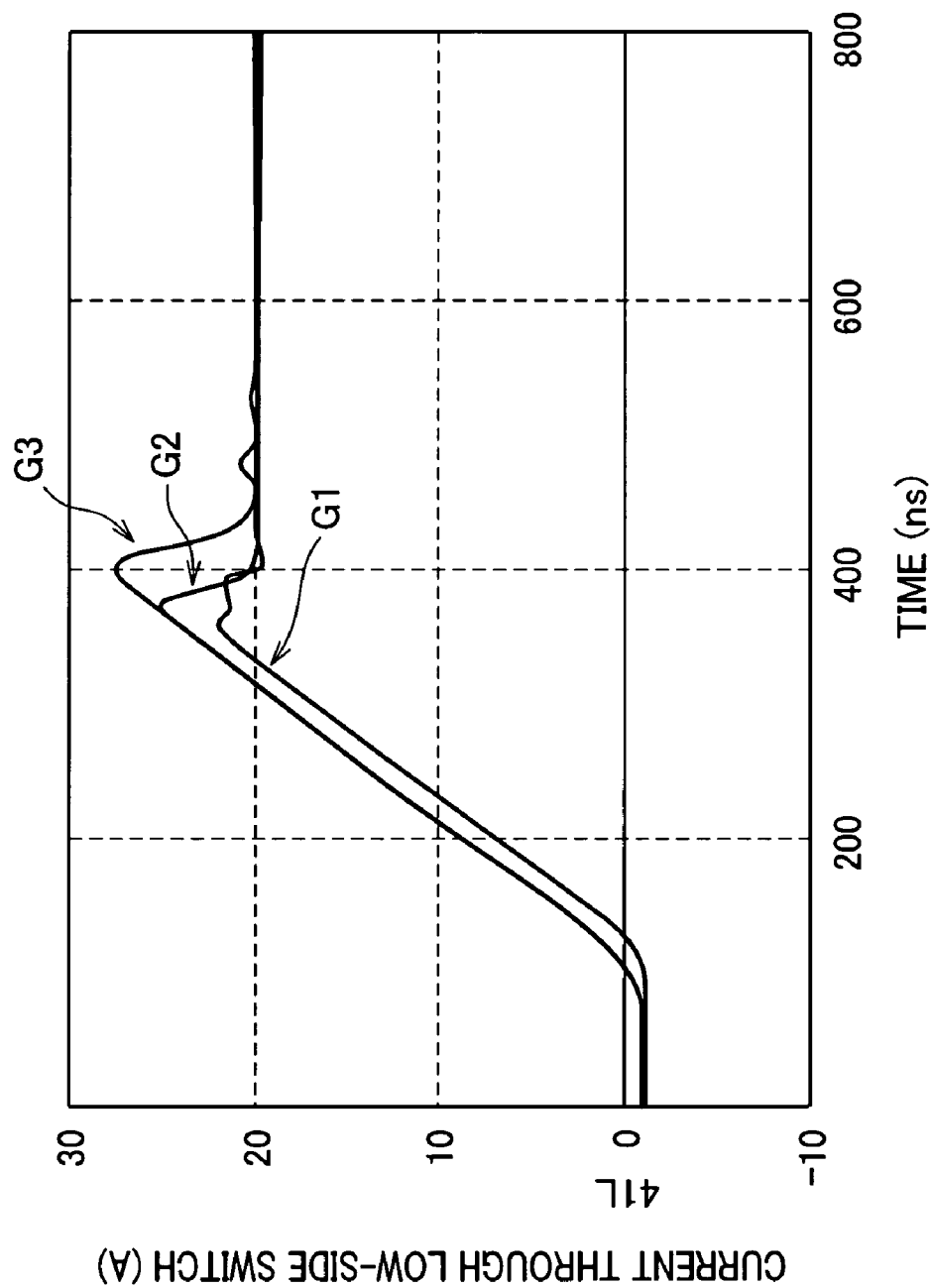

POWER SWITCHING CIRCUIT IMPROVED TO REDUCE LOSS DUE TO REVERSE RECOVERY CURRENT

CROSS REFERENCE TO RELATED APPLICATIONS

This application is based on Japanese Patent Application 2008-34524 filed on Feb. 15, 2008. The descriptions of the Patent Application are all incorporated herein by reference.

FIELD OF THE INVENTION

The present invention relates to power switching circuits with a switching element for switching on and off the switching element to thereby drive inductive loads. More particularly, the present invention relates to such power switching circuits with a diode connected in antiparallel to the switching element; is diode allows a flywheel current to flow therethrough.

BACKGROUND OF THE INVENTION

Semiconductor switching elements are installed in a power converter, such as an inverter, for driving inductive loads, such as motors. In order to bypass a current flowing in a semiconductor switching element when the semiconductor switching element is turned off, a diode is connected in antiparallel to the semiconductor switching element. Specifically, when the semiconductor switching element is turned off, a current, such as a flywheel current, flowing in the semiconductor switching element continues to flow through the diode.

Normal PN junction diodes have a reverse recovery time between instantaneous switching from a forward bias (conducting state) to a reverse bias (non-conducting state). During the reverse recovery time, a reverse recovery current flows through a PN junction diode due to movement of minority carriers (a few charge carriers) across the p-n junction.

For this reason, when a PN junction diode is used to be connected in antiparallel to such a semiconductor switching element, during the reverse recovery time, the reverse recovery current flows through the diode, resulting in increasing switching loss and noise.

In order to reduce the reverse recovery current, a fast recovery diode (FRD) having the minority carriers each with a reduced lifetime or a Schottky barrier diode having a very small reverse recovery time can be used as a diode connected in antiparallel to a semiconductor switching element installed in such a power converter.

On the other hand, when a MOSFET is used as a semiconductor switching element to be installed in a power converter, because MOSFETs each have an intrinsic diode intrinsically formed in antiparallel thereto, the intrinsic diode is used to cause a flywheel current to continuously flow therethrough.

Specifically, when a MOSFET is used as a semiconductor switching element to be installed in a power converter and the intrinsic diode is used to cause a flywheel current to continuously flow therethrough, during the reverse recovery time, the reverse recovery current flows through the intrinsic diode. This results in increasing switching loss and noise.

Particularly, the higher the breakdown voltage of a MOSFET is, the higher the reverse recovery current flowing trough the intrinsic diode of the MOSFET is. A MOSFET with a super junction structure (SJ) can be used as a semiconductor switching element to be installed in a power converter because it provides both a high breakdown voltage and a low resistance. However, when a MOSFET with the super junction structure (SJ) is used as a semiconductor switching element to be installed in a power converter, the reverse recovery current flowing through the intrinsic diode becomes high and has a steep time characteristic. This results in increasing loss and noise.

In order to reduce loss and/or noise due to the reverse recovery current flowing though the intrinsic diode of a MOSFET, nonpatent document 1 "POWER-MOSFET APPLICATION TECHNOLOGY", published by Nikkan Kogyo Shimbun Ltd., discloses, on page 139, that a diode with a low breakdown voltage is connected in anti-series to the intrinsic diode of a MOSFET. This prevents a forward current from flowing through the intrinsic diode.

In order to reduce loss and/or noise due to the reverse recovery current flowing though the intrinsic diode of a MOSFET, U.S. Pat. No. 6,058,037 corresponding to Japanese Patent Application Publication No. H10-327585 discloses an external circuit that applies a low reverse voltage to the intrinsic diode of a MOSFET. The low reverse voltage applied to the intrinsic diode causes reverse recovery of the intrinsic diode, thus reducing loss due to the reverse recovery current flowing though the intrinsic diode of the MOSFET.

European Patent Application Publication No. EP1814216 corresponding to Japanese Patent Application Publications No. 2006-141167 and No. 2006-141168 also discloses such an external circuit that applies a low reverse voltage to the intrinsic diode of a MOSFET.

However, the approach disclosed in the nonpatent document 1 may complicate the circuit structure consisting of the MOSFET and the diode. The approach disclosed in the nonpatent document 1 also may create loss due to the forward voltage drop across the anti-series diode upon the MOSFET being on.

The approach disclosed in each of the US Patent and EP Patent Application Publication requires, as the external circuit, a low-voltage source for creating the low voltage, a switch connected between the low-voltage source and the intrinsic diode, and a driver for turning on the switch to thereby apply the low voltage to the intrinsic diode.

Thus, the approach disclosed in each of the US Patent and EP Patent Application Publication may complicate the circuit structure consisting of the MOSFET and the external circuit, and remains loss due to the reverse recovery current based on the low voltage.

SUMMARY OF THE INVENTION

In view of the circumstances set forth above, an object of an aspect of the present invention is to provide power switching circuits having a simple structure and reducing loss and/or noise due to a diode, such as an intrinsic diode, connected in antiparallel to a switching element.

According to one aspect of the present invention, there is provided a power switching circuit. The power switching circuit includes a semiconductor switching element. The semiconductor switching element has a first terminal electrically connected to a power supply source and has a second terminal electrically connected to an inductive load. The power semiconductor switching element is configured to be switched on and off. The power switching circuit includes a first commutation member having a first commutation path and a first diode provided in the first commutation path. The first commutation path is electrically connected across the semiconductor switching element. The first diode is electrically connected antiparallel to the semiconductor switching element. While the semiconductor switching element is off, the first commutation path allows a first current based on the inductive load to flow therethrough in a forward direction of the first diode within a commutation period. The power switching circuit includes a second commutation member having a second commutation path and a second diode provided in the second commutation path. The second commutation path is electrically connected in parallel to the first commutation path. The second diode is electrically connected antiparallel to the semiconductor switching element. While the semiconductor switching element is off, the second commutation path allows a second current based on the inductive load to flow therethrough in a forward direction of the second diode within the commutation period. The first diode has a first reverse recovery time, the second diode has a second reverse recovery time. The second reverse recovery time is shorter than the first reverse recover time. The first commutation path has a first inductance. The second commutation path has a second inductance. The second inductance is higher than the first inductance.

According to the one aspect of the present invention, while the semiconductor switching element is off, the first commutation path allows the first current based on the inductive load to flow therethrough in the forward direction of the first diode within the commutation period. Similarly, while the semiconductor switching element is off, the second commutation path allows the second current based on the inductive load to flow therethrough in the forward direction of the second diode within the commutation period. Because the second inductance is higher than the first inductance, after the first current becomes zero, a current, such as a de-energizing current, continues to flow through the second commutation path based on an electromagnetic energy charged in the second inductance during the commutation period.

Thus, as compared with the structure in which no second inductance is provided in the second commutation path or the second inductance is lower than the first inductance, it is possible to reduce a reverse recovery current through the first diode. This allows the sum of a current flowing through each of the first and second diodes after the commutation period to be immediately reduced. Note that, because the second diode has a reverse recovery characteristic superior than that of the first diode based on the difference between their reverse recovery times, an adverse effect of the reverse recovery characteristic of the second diode is relatively reduced.

In addition, with the configuration of the one aspect of the present invention, a reverse recovery current that conventionally flowed only the first diode is separated to flow both the first diode and the second diode. This makes it possible to reduce the amount of minor carries charged in the first diode by a forward current flowing through the first diode.

Accordingly, the power switching circuit of the one aspect of the present invention has a simple structure in which the second inductance and the second diode are connected across the first diode; this simple structure achieves the effects set forth above. This therefore increases the availability of the power switching circuit.

BRIEF DESCRIPTION OF THE DRAWINGS

Other objects and aspects of the invention will become apparent from the following description of embodiments with reference to the accompanying drawings in which:

FIG. 13 is graphs schematically illustrating the waveforms of:

an actually measured current that rises when the low-side MOSFET is ON in the power switching circuit according to the embodiment;

an actually measured current that rises when the low-side MOSFET is ON in a first comparative power switching circuit; and an actually measured current that rises when the low-side MOSFET is ON in a second comparative power switching circuit.

DETAILED DESCRIPTION OF EMBODIMENTS OF THE INVENTION

An embodiment of the present invention will be described hereinafter with reference to the accompanying drawings.

Figure 1A:
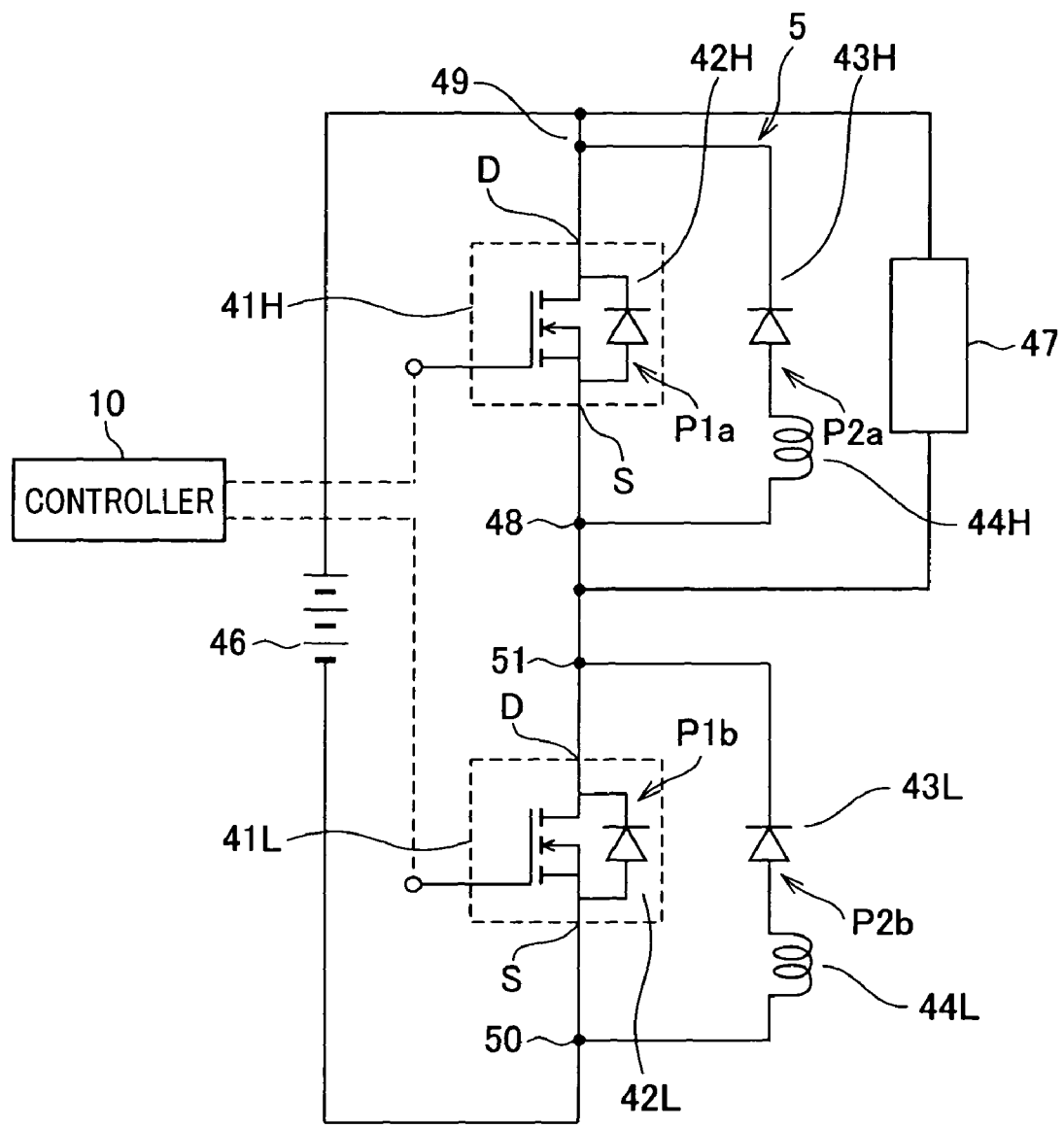
FIG. 1A is a circuit diagram schematically illustrating an example of the structure of a power switching circuit for driving a inductive load according to an embodiment of the present invention.

Referring to FIG. 1A, there is provided a power switching circuit 1 for driving an inductive load 47 according to the embodiment of the present invention.

The power switching circuit 1 includes a direct current (DC) battery 46 and a half-bridge module 5.

The half-bridge module 5 includes a pair (bridge arm) of series-connected high-side and low-side MOSFETs 41H and 41L serving as switching elements, intrinsic diodes 42H and 42L of the respective MOSFETs 41H and 41l, and Schottky barrier diodes (Schottky diodes) 43H and 43L. Each of the intrinsic diodes 42H and 42L serves as a first diode (first commutation diode), and each of the Schottky diodes 43H and 43L serves as a second diode (second commutation diode).

In FIG. 1A, reference character 44H represents an inductance of wiring, and reference character 44L represents an inductance of wiring.

Specifically, the half-bridge module 5 consists of an upper arm switch and a lower arm switch.

The upper arm switch consists of a high-side terminal 49 electrically connected to a positive electrode of the DC battery 46, and a load-side terminal 48 electrically connected to one low-potential side of the inductive load 47.

The upper arm switch also consists of the MOSFET 41H whose drain is electrically connected to the high-side terminal 49, and whose source is electrically connected to the load-side terminal 48. Through a main-current path defined from the high-side terminal 49 to the load-side terminal 48 through the MOSFET 41H, the on and off switchings of the MOSFET 41H cause a current based on the DC battery 46 to intermittently flow.

The first diode 42H is contained in a semiconductor chip of the MOSFET 41H and connected in antiparallel to the MOSFET 41H. The semiconductor chip of the MOSFET 41H is illustrated by dashed lines.

A current path defined from the high-side terminal 49 to the load-side terminal 48 through the first diode 42H will be referred to as "first commutation path P1a" hereinafter.

The second diode (Schottky Barrier Diode) 43H is electrically connected to the inductance 44H in series. The set of series-connected second diode 43H and the inductance 44H is electrically connected in antiparallel to the MOSFET 41H integrated with the first diode 42H.

A current path defined from the high-side terminal 49 to the load-side terminal 48 through the second diode 43H and the inductance 44H will be referred to as "second commutation path P2a" hereinafter.

More specifically, the high-side terminal 49 of the MOSFET 41H consists of a branching point to which the drain D of the MOSFET 41H, a positive electrode of the DC battery 46, and the cathode of the second diode 43H are electrically connected. The other high-potential side of the inductive load 47 is electrically connected to the positive electrode of the DC battery 46.

Similarly, the load-side terminal 48 of the MOSFET 41H consists of a branching point to which the source S of the MOSFET 41H, the one low-potential side of the inductive load 47, and the anode of the second diode 43H.

The lower arm switch consists of a low-side terminal 50 electrically connected to a negative electrode of the DC battery 46, and a load-side terminal 51 electrically connected to the one low-potential side of the inductive load 47.

The lower arm switch also consists of the MOSFET 41L whose drain D is electrically connected to the load-side terminal 51, and whose source S is electrically connected to the low-side terminal 50. Through a main-current path defined from the load-side terminal 51 to the low-side terminal 50 through the MOSFET 41L, the on and off switchings of the MOSFET 41L causes a current to intermittently flow.

The first diode 42L is contained in a semiconductor chip of the MOSFET 41L and connected in antiparallel to the MOSFET 41L. The semiconductor chip of the MOSFET 41L is illustrated by dashed lines.

A current path defined from the load-side terminal 51 to the low-side terminal 50 through the first diode 42L will be referred to as "first commutation path P1b" hereinafter.

The second diode (Schottky diode) 43L is electrically connected to the inductance 44L in series. The set of series-connected second diode 43L and the inductance 44L is electrically connected in antiparallel to the MOSFET 41L integrated with the first diode 42L.

A current path defined from the load-side terminal 51 to the low-side terminal 50 through the second diode 43L and the inductance 44L will be referred to as "second commutation path P2b" hereinafter.

More specifically, the low-side terminal 50 of the MOSFET 41L consists of a branching point to which the source S of the MOSFET 41L, the negative electrode of the DC battery 46, and the anode of the second diode 43L are electrically connected.

Similarly, the load-side terminal 51 of the MOSFET 41L consists of a branching point to which the drain D of the MOSFET 41L, the one low-potential side of the inductance 47, and the cathode of the second diode 43L.

The second diode 43H consisting of the Schottky diode has a reverse recovery time shorter than that of the corresponding first diode 42H. Similarly, the second diode 43L consisting of the Schottky diode has a reverse recovery time shorter than that of the corresponding first diode 42L.

Each of the second diodes 43H and 43L can consist of a PN junction diode. In this modification, doping a breakdown layer close to a p-n junction of a PN junction diode with a heavy metal, such as gold (Au), platinum (Pt), or the like, reduces a lifetime of each of minority carriers of the PN junction diode. This reduces a reverse recovery time of the PN junction diode to thereby create a fast recovery diode to be used as each of the second diodes 43H and 43K.

The forward threshold voltage value of a Schottky diode is lower than that of a PN junction diode. For this reason, it is possible to reduce a flywheel current that flows through the first diode (intrinsic diode) 42H, resulting in reducing a value of the inductance 44H. Similarly, it is possible to reduce a flywheel current that flows through the first diode (intrinsic diode) 42L, resulting in reducing a value of the inductance 44L.

Each of the second diodes 43H and 43L can consist of the set of a PN junction diode and a Schottky diode that are electrically connected in parallel to each other. Each of the second diodes 43H and 43L can consist of a junction barrier Schottky diode so as to improve the breakdown characteristic of the junction barrier Schottky diode as compared with that of a normal Schottky diode.

The power switching circuit 1 further includes a controller 10 electrically connected to the gate of each of the MOSFETs 41H and 41L.

The controller 10 is capable of individually driving on and off each of the high-side switch (MOSFET) 41H and the low-side switch (MOSFET) 41L to thereby apply a voltage based on a DC voltage across the DC battery 46 to the inductive load 47 for driving the inductive load 47.

The controller 10 is operative to variably control a duty (duty cycle) of each of the individual MOSFETs 41H and 41L, that is, the ratio of on duration of each of the individual MOSFET 41H and 41L per one cycle (on and off cycle) to thereby control operating conditions of the inductive load 47.

Next, operations of the power switching circuit 1 according to the embodiment will be described hereinafter. Particularly, in the embodiment, operations of the power switching circuit 1 when the controller 10 cyclically switches the lower arm switch (low-side switch) on and off will be described hereinafter with reference to FIGS. 1A and 2A.

Figure 2A:
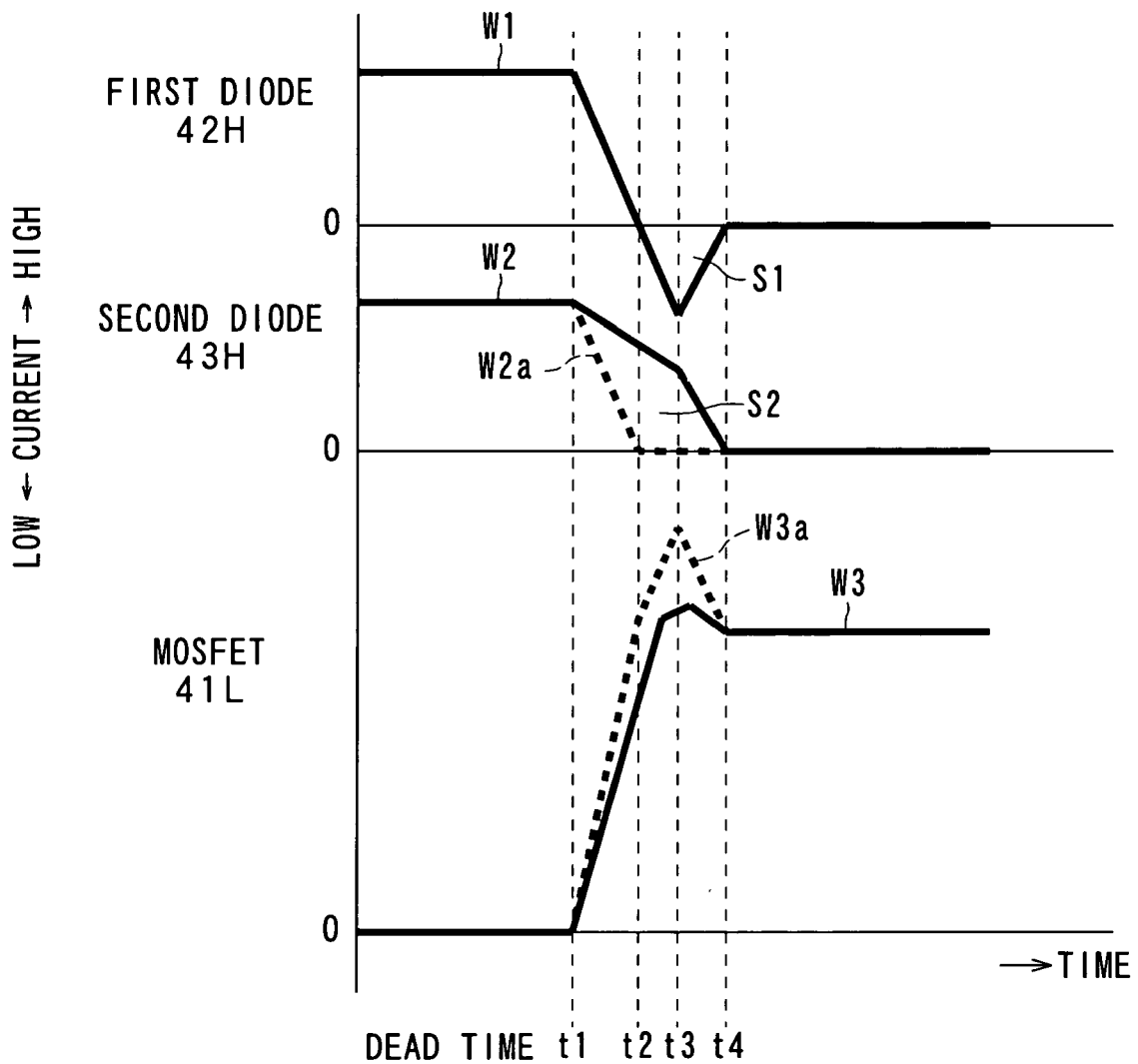
FIG. 2A is a waveform diagram schematically illustrating the waveform of a current through a first diode illustrated in FIG. 1A, the waveform of a current through a second diode illustrated in FIG. 1A; and that of a current through a high-side MOSFET illustrated in FIG. 1A.

Referring to FIG. 2A, before time t1, both the MOSFETs 41H and 41L are off. In other words, there is a dead time during which both the MOSFETs 41H and 41L are off.

Note that, while the MOSFET 41L is ON immediately before the dead time, a current based on the DC battery 46 flows through a closed loop consisting of the DC battery 46, the inductive load 47, and the MOSFET 41L. This allows electromagnetic energy to be charged in the inductive load 47.

Thus, during the dead time before time t1, a load current based on the electromagnetic energy stored in the inductive load 47 flows as a flywheel current through each of the first and second diodes 42H and 43H (first and second commutation paths P1a and P2a).

Specifically, the load current is distributed to flow through the first diode 42H and flow through the second diode 43H.

In a preferred example, the characteristics of the first diode 42H and those of the second diode 43H can be adjusted such that a distributed current flowing through the first diode 42H is equal to that flowing through the second diode 43H. In another preferred example, the characteristics of the first diode 42H and those of the second diode 43H can be adjusted such that a distributed current flowing through the second diode 43H is higher than that flowing through the first diode 42H.

The flywheel current flowing through the second diode 43H allows electromagnetic energy to be charged in the inductance 44H.

Thereafter, at time t1, the controller 10 controls the MOSFET 41L to be switched on. This allows a current to flow through the channel of the MOSFET 41L. This reduces the amount of the flywheel current flowing through each of the first and second commutation paths P1a and P2a.

Because the inductance 44H causes a back EMF (Electro Motive Force) when the flywheel current flowing through the second commutation path P2a is reduced, the rate of reduction in the flywheel current flowing through the second commutation path P2a is lower than that of reduction in the flywheel current flowing through the first commutation path P1a.

For this reason, after time t1, when a forward current through the first diode 42H becomes zero at time t2, a flywheel current i2 continues to flow through the second diode 43H based on the electromagnetic energy stored in the inductance 44H.

After the forward current through the first diode 42H becomes zero, a reverse recovery current ir flows through the first diode 42H from the drain D to the source S from time t2 to time t4. The reverse recover current ir is the highest at time t3 between time t2 and time t4.

As a result, during a period from time t2 to time t4, a current component "ir−i2" defined by subtracting the flywheel current i2 based on the electromagnetic energy charged in the inductance 44H from the reverse recovery current ir flows through the channel of the MOSFET 41L.

As illustrated in FIG. 2A, the period between time t2 and time t4 corresponds to, for example, a turn-on time of the MOSFET 41L. For this reason, the channel resistance of the MOSFET 41L during the period between time t2 and time t4 is higher than that during a stable on period of the MOSFET 41L after the turn-on time.

Thus, if the inductance 44H was negligible so that no flywheel current i2 flows through the second commutation path P2a, the reverse recovery current ir flowing trough the MOSFET 41L would cause an additional ohmic loss (resistance loss) in the MOSFET 41L. The additional ohmic loss is represented by the product of the square of the reverse recovery current ir and the channel resistance.

In other words, a voltage across the channel of the MOSFET 41L is reduced from a value identical to the voltage across the DC battery 46 upon the MOSFET 41L being on to nearly zero upon the MOSFET 41L being off.

However, if the inductance 44H was negligible, during the period from time t2 to time t4, the voltage across the channel of the MOSFET 41L is sufficient large. This may cause an additional ohmic loss in the MOSFET 41L; this additional ohmic loss is represented by the product of the current component and the voltage across the channel of the MOSFET 41L.

In contrast, in the embodiment, the current component "ir−i2" defined by subtracting the flywheel current i2 based on the electromagnetic energy charged in the inductance 44H from the reverse recovery current ir flows trough the MOSFET 41L during the period between time t2 and time t4.

For this reason, it is possible for the power switching circuit 1 to reduce, by a level of the second flywheel current i2, a current flowing through the MOSFET 41L during the period from time t2 to time t4 according to the embodiment as compared with a power switching circuit that does not consider the inductance 44H in the second commutation path P2a. This results in reducing ohmic loss and noise in the MOSFET 41L as compared with the power switching circuit that does not consider the inductance 44H in the second commutation path P2a.

As described above, the power switching circuit 1 is configured to switch on and off the second switch 41L while keeping the first switch 41H off to thereby drive the inductive load 47 and reduce ohmic loss and noise in the MOSFET 41L.

Modification of the power switching circuit 1 allows ohmic loss in the MOSFET 41H to be reduced.

Figure 1B:
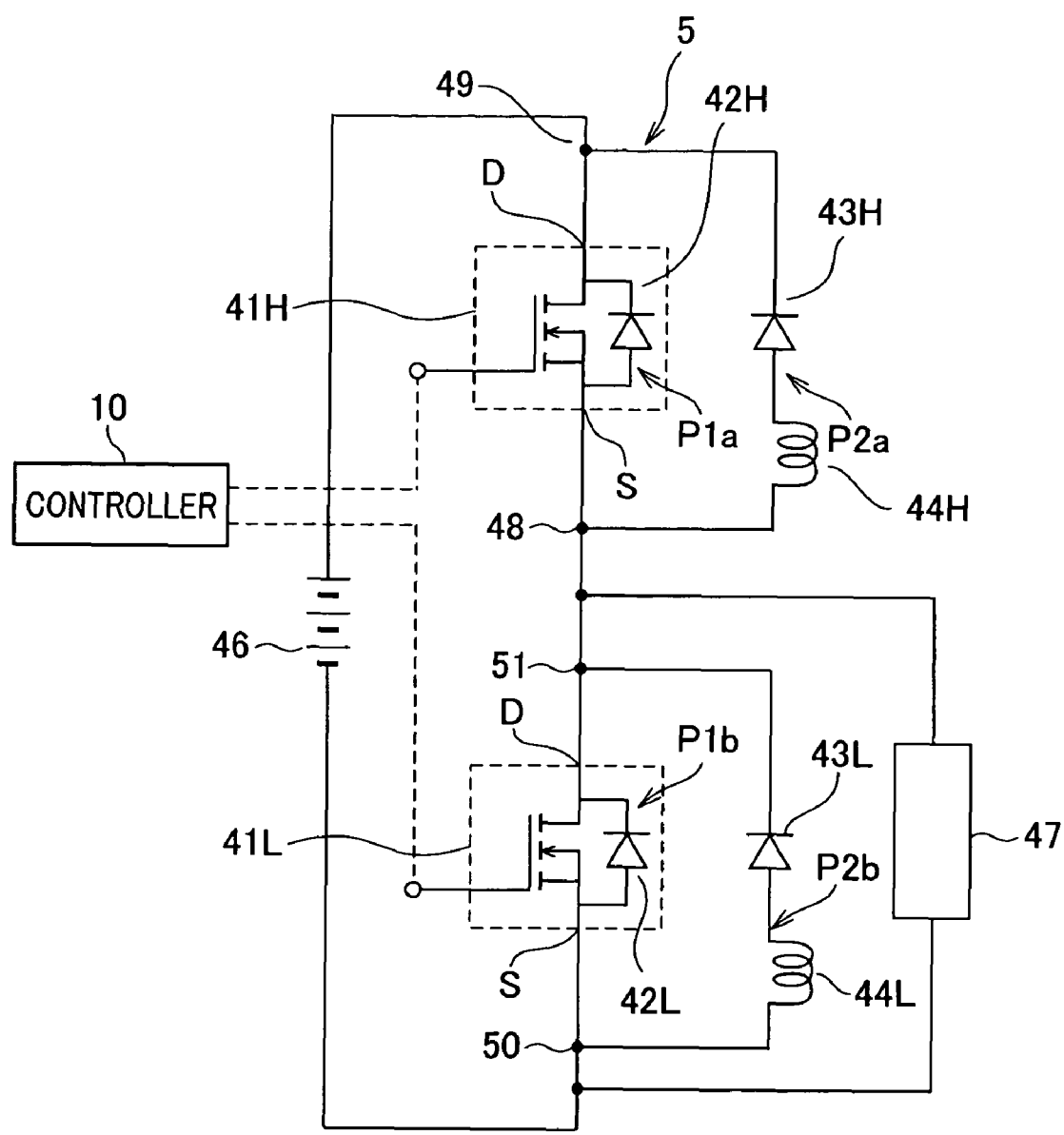
FIG. 1B is a circuit diagram schematically illustrating an example of the structure of a power switching circuit according to a modification of the embodiment of the present invention.

FIG. 1B schematically illustrates an example of the structure of a power switching circuit 1A according to the modification of the power switching circuit 1.

Specifically, as a different point of the structure of the power switching circuit 1A from that of the power switching circuit 1, the inductive load 47 is electrically connected at its one low-potential side to the low-side terminal 50, and at its other high-potential side to the load-side terminal 51.

As well as operations of the power switching circuit 1, operations of the power switching circuit 1A when the controller 10 cyclically switches the higher arm switch (high-side switch) on and off will be described hereinafter with reference to FIGS. 1B and 2B.

Figure 2B:
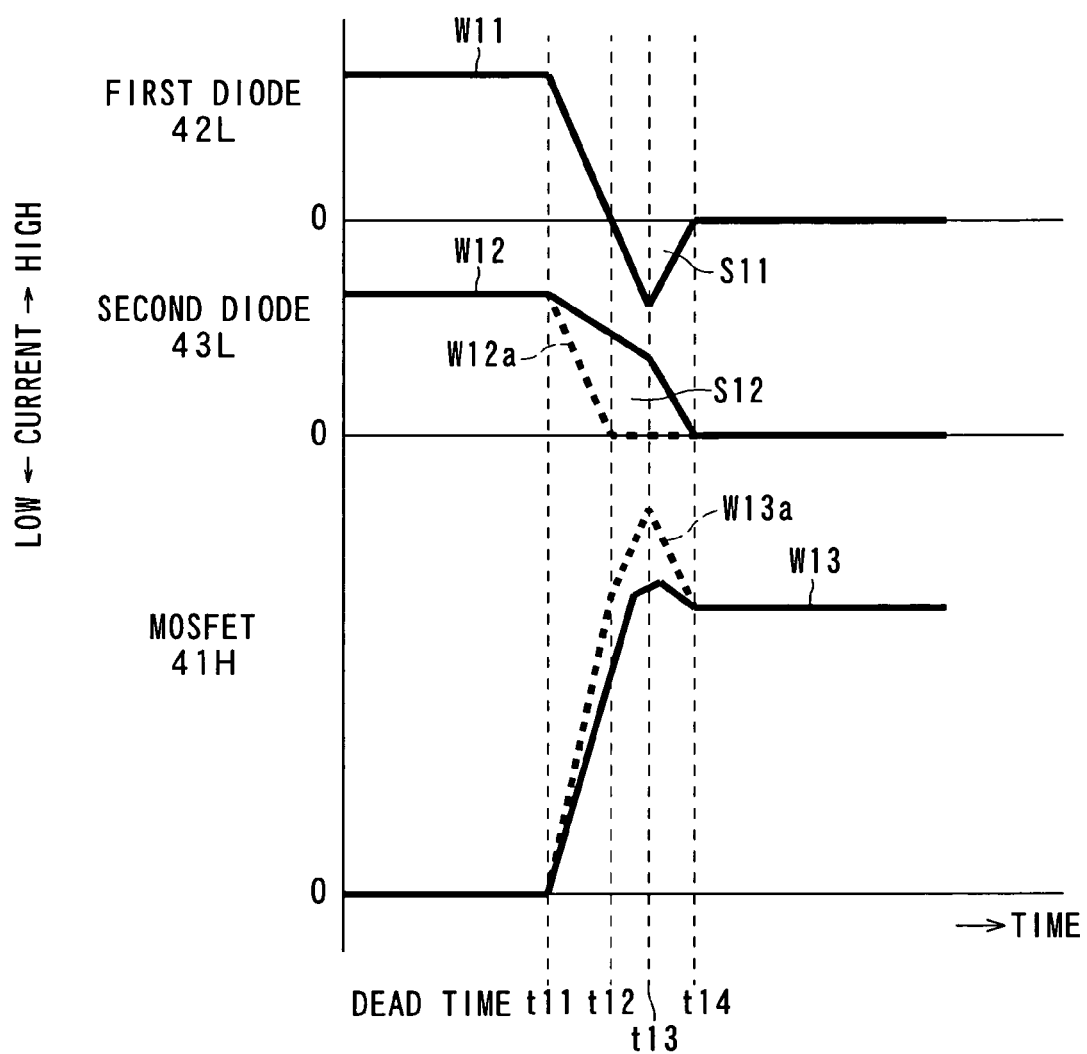
FIG. 2B is a waveform diagram schematically illustrating the waveform of a current through a first diode illustrated in FIG. 1B, the waveform of a current through a second diode illustrated in FIG. 1B; and that of a current through a low-side MOSFET illustrated in FIG. 1B.

Referring to FIG. 2B, before time t11, both the MOSFETs 41H and 41L are off. In other words, there is a dead time during which both the MOSFETs 41H and 41L are off.

Note that, while the MOSFET 41H is ON immediately before the dead time, a current based on the DC battery 46 flows through a closed loop consisting of the DC battery 46, the MOSFET 41H, and the inductive load 47. This allows electromagnetic energy to be charged in the inductive load 47.

Thus, during the dead time before time t11, a load current based on the electromagnetic energy stored in the inductive load 47 flows as a flywheel current through each of the first and second diodes 42L and 43L (first and second commutation paths P1b and P2b).

Specifically, the load current is distributed to flow through the first diode 42L and flow through the second diode 43L.

The flywheel current flowing through the second diode 43L allows electromagnetic energy to be charged in the inductance 44L.

Thereafter, at time t11, the controller 10 controls the MOSFET 41H to be switched on. This allows a current to flow through the channel of the MOSFET 41H. This reduces the amount of the flywheel current flowing through each of the first and second commutation paths P1b and P2b.

Because the inductance 44L causes a back EMF when the flywheel current flowing through the second commutation path P2b is reduced, the rate of reduction in the flywheel current flowing through the second commutation path P2b is lower than that of reduction in the flywheel current flowing through the first commutation path P1b.

For this reason, after time t11, when a forward current through the first diode 42L becomes zero at time t12, a flywheel current i2a continues to flow through the second diode 43L based on the electromagnetic energy stored in the inductance 44L.

After the forward current through the first diode 42L becomes zero, a reverse recovery current ira flows through the first diode 42L from the drain D to the source S from time t12 to time t14. The reverse recovery current ira is the highest at time t13 between time t12 and time t14.

As a result, during a period from time t12 to time t14, a current component "ira−i2a" defined by subtracting the flywheel current i2a based on the electromagnetic energy charged in the inductance 44L from the reverse recovery current ira flows through the channel of the MOSFET 41H.

As illustrated in FIG. 2B, the period between time t12 and time t14 corresponds to, for example, a turn-on time of the MOSFET 41H. For this reason, the channel resistance of the MOSFET 41H during the period between time t12 and time t14 is higher than that during a stable on period of the MOSFET 41H after the turn-on time.

Thus, if the inductance 44L was negligible so that no flywheel current i2a flows through the second commutation path P2b, the reverse recovery current ira flowing through the MOSFET 41H would cause an additional ohmic loss in the MOSFET 41H; this additional ohmic loss is represented by the product of the square of the reverse recovery current ira and the channel resistance.

In other words, a voltage across the channel of the MOSFET 41H is reduced from a value identical to the voltage across the DC battery 46 upon the MOSFET 41H being on to nearly zero upon the MOSFET 41H being off.

However, if the inductance 44L was negligible, during the period from time t12 to time t14, the voltage across the channel of the MOSFET 41H is sufficiently large. This may cause an additional ohmic loss in the MOSFET 41H; this additional ohmic loss is represented by the product of the current component and the voltage across the channel of the MOSFET 41L.

In contrast, in the embodiment, the current component "ira−i2a" defined by subtracting the flywheel current i2a based on the electromagnetic energy charged in the inductance 44L from the reverse recovery current ira flows through the MOSFET 41H during the period between time t12 and time t14.

For this reason, it is possible for the power switching circuit 1A to reduce, by a level of the second flywheel current i2a, a current flowing through the MOSFET 41H during the period from time t12 to time t14 according to the embodiment as compared with a power switching circuit that does not consider the inductance 44L.

In FIG. 2A, the waveform of a current flowing through the first commutation path P1a according to the embodiment is illustrated by solid line with reference character W1, and the waveform of a current flowing through the second commutation path P2a according to the embodiment is illustrated by solid line with reference character W2. In addition, the waveform of a current flowing through the MOSFET 41L according to the embodiment is illustrated by solid line with reference character W3.

In FIG. 2A, the waveform of a current flowing through the second commutation path P2a when the inductance 44H is negligible is illustrated by dashed line with reference character W2a and the waveform of a current flowing through the MOSFET 41L when the inductance 44H is negligible is illustrated by dashed line with reference character W3a. Note that, in FIG. 2A, no reverse recovery current flows through the second diode 43H because the Schottky diode is used as the second diode 43H.

Similarly, In FIG. 2B, the waveform of a current flowing through the first commutation path P1b according to the embodiment is illustrated by solid line with reference character W11, and the waveform of a current flowing through the second commutation path P2b according to the embodiment is illustrated by solid line with reference character W12. In addition, the waveform of a current flowing through the MOSFET 41H according to the embodiment is illustrated by solid line with reference character W13.

In FIG. 2B, the waveform of a current flowing through the second commutation path P2b when the inductance 44H is negligible is illustrated by dashed line with reference character W12a and the waveform of a current flowing through the MOSFET 41L when the inductance 44L is negligible is illustrated by dashed line with reference to the character W13a. Note that, in FIG. 2B, no reverse recovery current flows through the second diode 43L because the Schottky diode is used as the second diode 43L.

As clearly illustrated in FIG. 2A, if the current through the second diode 43H is zero during the reverse recovery current flowing through the first diode 42H (see the waveform W2a), a current flowing through the MOSFET 41H would be increased (see the waveform W3a). This would increase ohmic loss in the MOSFET 41H.

However, in the embodiment, the current through the second diode 43H continuously flows during the reverse recovery current flowing through the first diode 42H (see the waveform W2). This allows a current flowing through the MOSFET 41H to be reduced (see the waveform W3). This reduces ohmic loss and noise in the MOSFET 41H.

Similarly, as clearly illustrated in FIG. 2B, if the current through the second diode 43L is zero during the reverse recovery current flowing through the first diode 42L (see the waveform W12a), a current flowing through the MOSFET 41L would be increased (see the waveform W13a). This would increase ohmic loss in the MOSFET 41L.

However, in the embodiment, the current through the second diode 43L continuously flows during the reverse recovery current flowing through the first diode 42L (see the waveform W12). This allows a current flowing through the MOSFET 41L to be reduced (see the waveform W13). This reduces ohmic loss and noise in the MOSFET 41L.

The principle of the embodiment of the present invention has been described with reference to FIGS. 1A and 1B. In addition to the descriptions, more actual operations of the power switching circuit 1 using an equivalent circuit of the first and second commutation paths P1a and P2a during the period from time t2 to time t4 will be described hereinafter with reference to FIG. 3.

Figure 3:
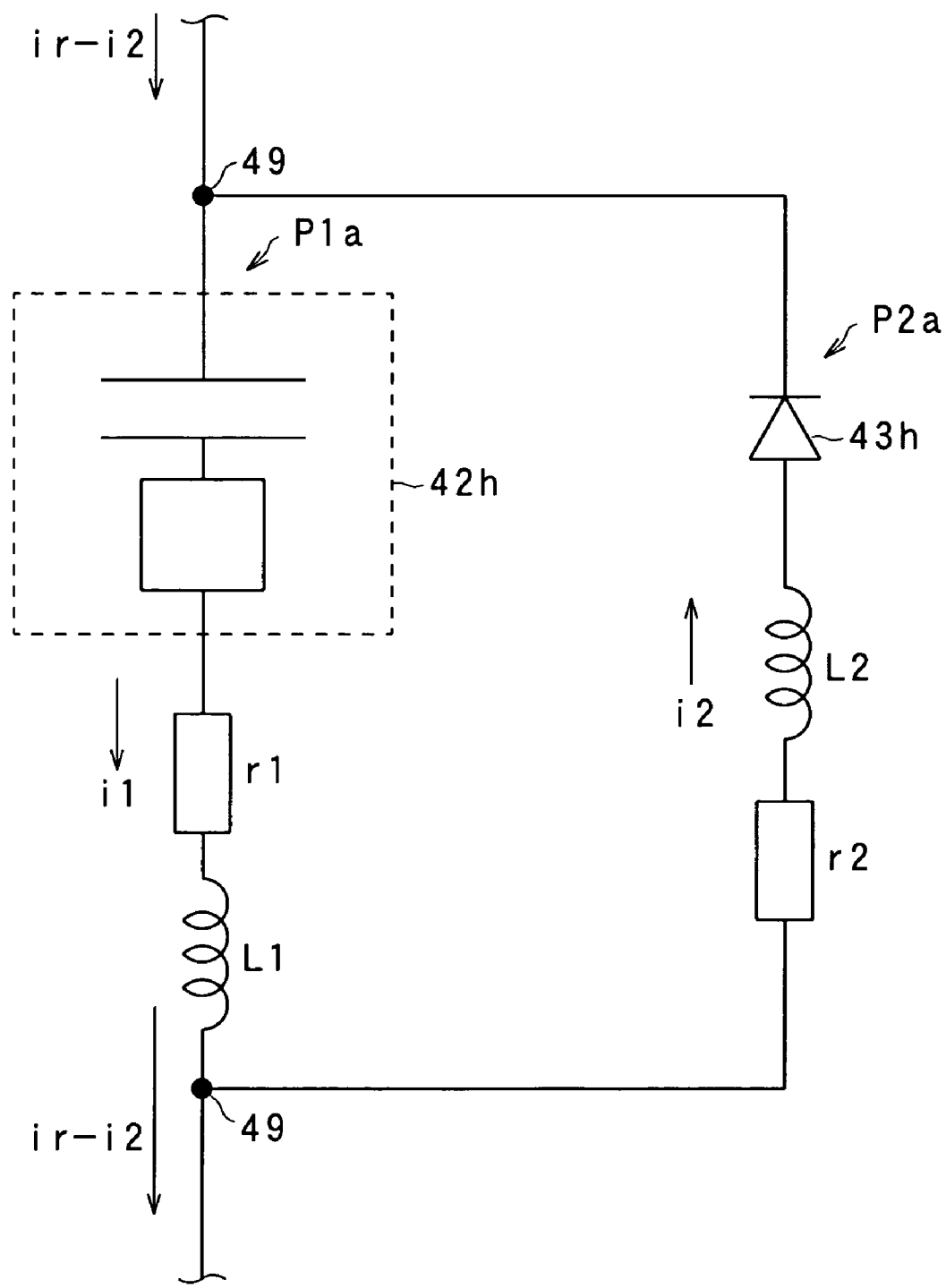
FIG. 3 is a circuit diagram schematically illustrating an equivalent circuit of a first commutation path and a second commutation path illustrated in FIG. 1.

Specifically, in FIG. 3, as described above, reference character ir represents the reverse recovery current that flows through the first commutation path P1a during the period from time t2 to time t4. Reference character i2 represents the flywheel current that flows through the second commutation path P2a based on the electromagnetic energy stored in the inductance 44H during the period from time t2 to time t4.

Reference character r1 represents a resistance of the first commutation path P1a, and reference character L1 represents an inductance of the first commutation path P1a. Reference character r2 represents a resistance of the second commutation path P2a, and reference character L2 represents an inductance of the second commutation path P2a corresponding to the inductance 44H.

The reverse recovery current ir is designed to flow through the resistance r1 and the inductance L1. The flywheel current i2 is determined based on: the electromagnetic energy charged in the inductance 44H (inductance L2) and a forward voltage drop $\Delta V$ across the second diode 43H, and the resistance r2. The electromagnetic energy, referred to "E", charged in the inductance 44H (inductance L2) is expressed by the following equation.

$$E = \frac{1}{2} L2 \cdot i2 \cdot i2$$

Adjustment of the parameters, such as r1, r2, L1, L2, $\Delta V$, allows the average value (integrated value) of the reverse recovery current ir over the period from time t2 to time t4 to be equal to the average value (integrated value) of the flywheel current i2 over the period from time t2 to time t4.

Specifically, the area S1 of the waveform W1 over time t2 to time t4 corresponding to the integrated value thereover is substantially equal to the area S2 of the waveform W2 over time t2 to time t4 corresponding to the integrated value thereover (see FIG. 2A). Similarly, the area S11 of the waveform W11 over time t12 to time t14 corresponding to the integrated value thereover is substantially equal to the area S12 of the waveform W12 over time t12 to time t14 corresponding to the integrated value thereover (see FIG. 2B).

This allows the average value of the difference in current between the reverse recovery current ir and the flywheel current i2 to substantially become zero. This effectively reduces ohm loss and noise in the MOSFET 41L due to the current difference.

Note that the average value (integrated value) of the reverse recovery current ir over the period from time t2 to time t4 equal to the average value (integrated value) of the flywheel current i2 over the period from time t2 to time t4 is defined such that:

the average value (integrated value) of the flywheel current i2 over the period from time t2 to time t4 lies within a range from 50 percent of the average value (integrated value) of the reverse recovery current ir over the period from time t2 to time t4 to 150 percent thereof.

More preferably, the average value (integrated value) of the reverse recovery current ir over the period from time t2 to time t4 equal to the average value (integrated value) of the flywheel current i2 over the period from time t2 to time t4 is defined such that:

the average value (integrated value) of the flywheel current i2 over the period from time t2 to time t4 is placed within a range from 50 percent of the average value (integrated value) of the reverse recovery current ir over the period from time t2 to time t4 to 100 percent thereof.

The relationship between the inductance L1 and the inductance L2 will be described hereinafter with reference to FIG. 4.

Figure 4:
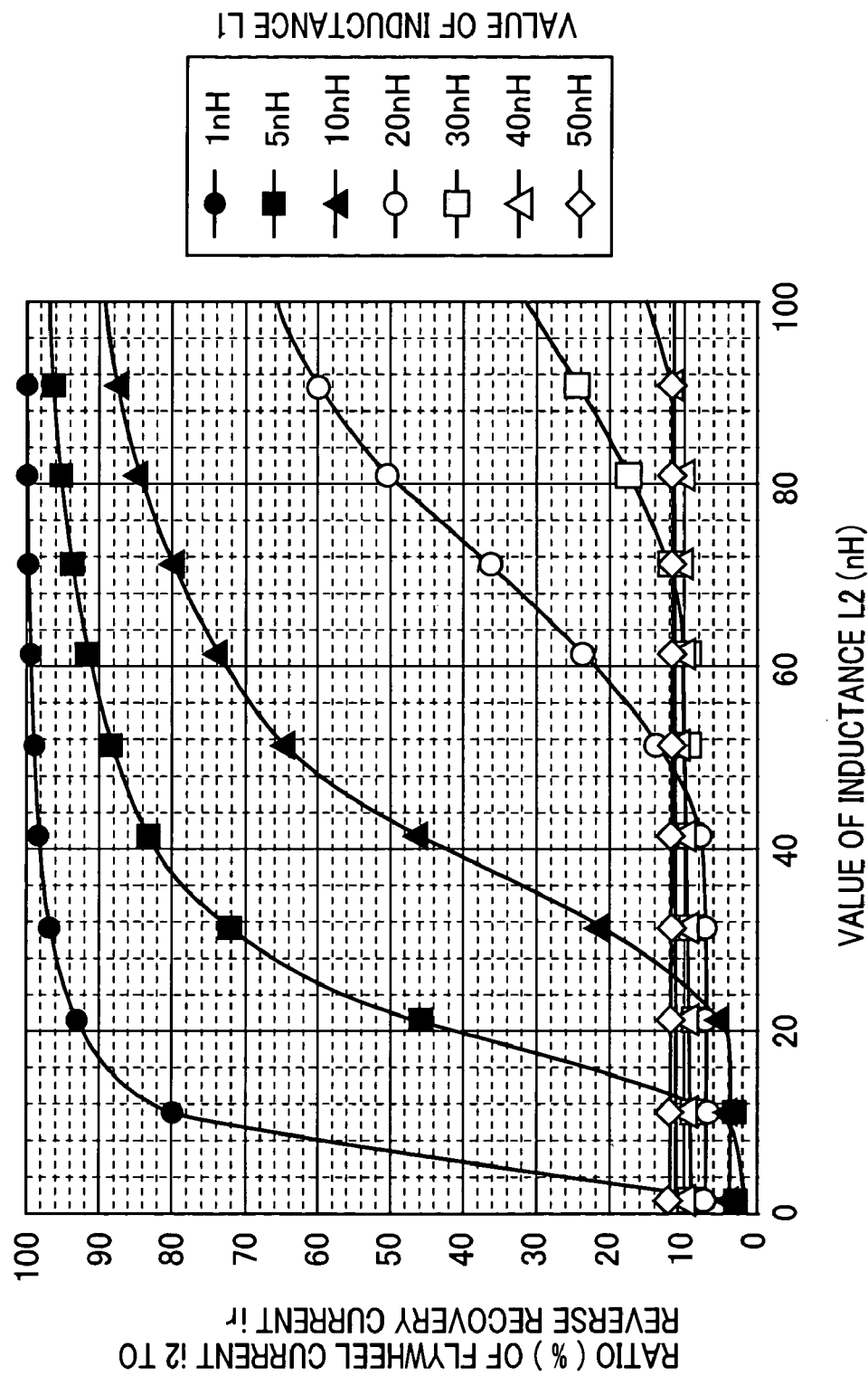
FIG. 4 is a view schematically illustrating the relationships between a variable of the ratio of a flywheel current i2 to a reverse recovery current ir, a variable of an inductance L1, and a variable of an inductance L2 according to the embodiment.

FIG. 4 illustrates how the ratio, in percent, of the flywheel current i2 to the reverse recovery current ir is vaned while the inductances L1 and L2 are varied. In other words, FIG. 4 illustrates the relationships between a variable of the ratio of the flywheel current i2 to the reverse recovery current ir, a variable of the inductance L1, and a variable of the inductance L2.

Note that the relationships illustrated in FIG. 4 were obtained by, for example, simulations using the power switching circuit 1 assuming that the forward characteristics of the first diode 42H are equal to those of the second diode 43H.

Specifically, FIG. 4 illustrates the ratio, in percent, of the average value of the flywheel current i2 over the period from time t2 to time t4 to the average value of the reverse recovery current ir over the period from time t2 to time t4. As clearly illustrated in FIG. 4, the higher the value of the inductance L2 and the lower the value of the inductance L1 are, the greater the ratio of the average value of the flywheel current i2 to the average value of the reverse recovery current ir is.

Preferably, the value of the inductance L2 be set to be two to eight times, more preferably, three to seven times, still more preferably, four to six times, greater than the value of the inductance L1.

For example, because a normal semiconductor switch to be used to the upper arm switch has an inductance of equal to or lower than 10 nanohenries (nH) in its first commutation path, the value of the inductance L2 is preferably set to be tens of nanohenries. For this reason, as the inductance 44H, an inductance of wiring of the second commutation path P2a can be used by, for example, adjusting the length of the second commutation path P2a.

If the ratio of the value of the inductance L2 to the value of the inductance L1 was lower than 2, it would be insufficient to reduce the current difference "ir−i2", reducing the effect of decreasing loss and noise in the MOSFET 41L.

In other words, when the ratio of the value of the inductance L2 to the value of the inductance L1 is equal to or higher than 2, the effect of decreasing loss and noise in the MOSFET 41L can be maintained at a certain level.

Specifically, when the ratio of the value of the inductance L2 to the value of the inductance L1 is equal to or higher than 3, the effect of decreasing loss and noise in the MOSFET 41L can be maintained at a higher level.

More specifically, when the ratio of the value of the inductance L2 to the value of the inductance L1 is equal to or higher than 4, the effect of decreasing loss and noise in the MOSFET 41L can be maintained at a more higher level.

Otherwise, if the ratio of the value of the inductance L2 to the value of the inductance L1 was higher than 8, the inductance 44H would prevent the flywheel current i2 from flowing through the second diode 43H at the start of a commutation period. The commutation period represents a period during which the flywheel current flows through each of the first and second diodes 43H and 44H upon the MOSFET 41L being off; this commutation period corresponds to the period from time t1 to time t2.

This would increase the ratio of the flywheel current through the first diode 42H to the flywheel current i2 through the second diode 43H, resulting in increasing the reverse recovery current through the first diode 42H during a reverse recovery period from time t2 to time t4 after the commutation period.

In addition, the flywheel current I2 would be reduced, resulting in reducing the electromagnetic energy to be stored in the inductance 44H. This would reduce the flywheel current i2 during the reverse recovery period from time t2 to time t4, resulting in increasing the current difference "ir–i2". This would increase resistance loss in the MOSFET 41L during the reverse recovery period from time t2 to time t4.

In other words, when the ratio of the value of the inductance L2 to the value of the inductance L1 is equal to or lower than 8, it is possible to reduce the adverse effect of the inductance 44H on the flywheel current i2 through the second diode 43H at the start of a commutation period. The effect of decreasing loss and noise in the MOSFET 41L can be therefore maintained at a certain level.

When the ratio of the value of the inductance L2 to the value of the inductance L1 is equal to or lower than 7, it is possible to more reduce the adverse effect of the inductance 44H on the flywheel current i2 through the second diode 43H at the start of a commutation period. The effect of decreasing loss and noise in the MOSFET 41L can be therefore maintained at a higher level.

When the ratio of the value of the inductance L2 to the value of the inductance L1 is equal to or lower than 6, it is possible to still more reduce the adverse effect of the inductance 44H on the flywheel current i2 through the second diode 43H at the start of a commutation period. The effect of decreasing loss and noise in the MOSFET 41L can be therefore maintained at a more higher level.

Specifically, it is preferred that the value of the inductance L2 be set such that the level of the flywheel current i2 reach a steady-state level at the end of the reverse recovery period.

Figure 5:
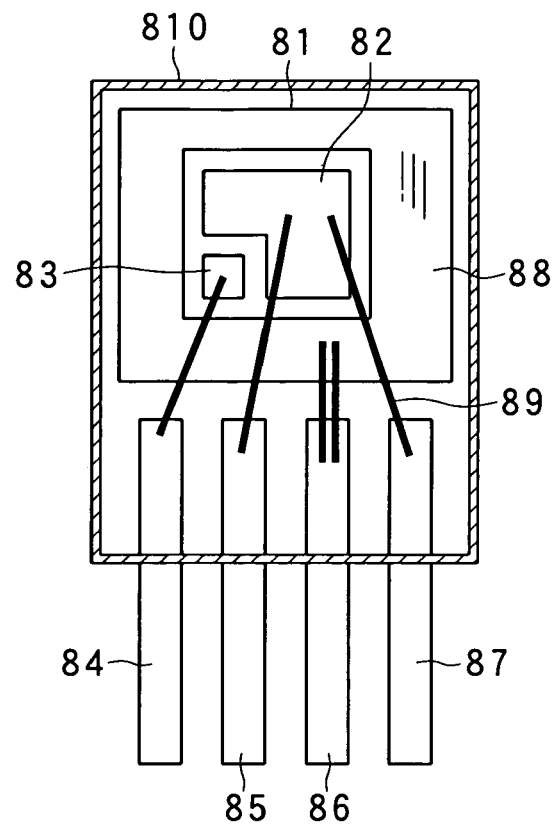
FIG. 5 is a partially cross-sectional view schematically illustrating the first packaging example of a high-side MOSFET integrated with a first commutation diode according to the embodiment.
Figure 6:
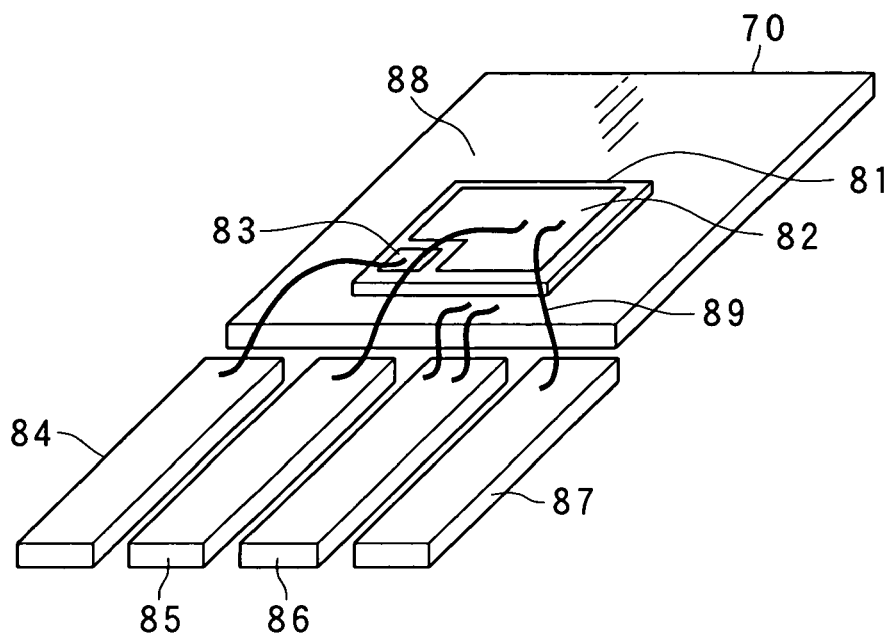
FIG. 6 is a perspective view schematically illustrating the first packaging example of the high-side MOSFET integrated with the first commutation diode according to the embodiment.

FIGS. 5 and 6 schematically illustrate the first packaging example of the MOSFET 41H integrated with the first commutation diode 42H. In the first packaging example, the MOSFET 41H is designed as a rectangular vertical MOSFET chip 81.

The source 82 and gate 83 are mounted on one surface of the vertical MOSFET chip 81, and the drain (not shown) is mounted on the other surface of the vertical MOSFET chip 81. Reference character 810 represents a package with four leads 84, 85, 86, and 87 located at one side thereof. The package 810 encapsulates the vertical MOSFET chip 81 with one ends of the four leads 84 to 87 projecting from the one side thereof.

The source 82 is joined to the other ends of the leads 85 and 87 by bonding wires 89. Reference character 88 represents a conductor, such as a conductive substrate, provided in the package 810. The drain is joined to the conductor 88, and the conductor 88 is joined to the other end of the lead 86 by bonding wires 89. The gate 83 is joined to the other end of the lead 84 by a bonding wire 89.

In the first packaging example, the one end of one of the leads 85 and 87 to be coupled to the source 82, such as the lead 85, is electrically connected to the anode of the second diode 43H. The one end of the other of the leads 85 and 87 to be coupled to the source 82, such as the lead 87, is joined to one end of a lead located through one side of a package that encapsulates the MOSFET 41L and to a terminal to be electrically connected to inductive load 47. The other end of the lead of the MOSFET 41L to be joined at its one end to the lead 87 is joined to the drain of the MOSFET 41L.

This configuration of the MOSFET 41H allows the source 82 of the MOSFET 41H, the anode of the second diode 43H, the drain of the MOSFET 41L, and the inductive load 47 to be separated at the source 82 of the MOSFET 41H as the branching point thereamong. This allows the inductance in the first commutation path P1a with the first diode 42H (the intrinsic diode) to be set to a minimum value.

In contrast, the second commutation path P2a including the second diode 43H has an inductance of a conductive path (wire) connecting from the source 82 of the MOSFET 41H to the anode of the second diode 43H through the lead 87. The inductance of the wire has normally one nH per 1 mm in increase of its longitudinal length although it depends on its shape and arrangement. This is because the inductance of a wire is normally proportional to the length of the wire.

Thus, adjustment of the length of wiring between the lead 87 and the anode of the second diode 43H within a few centimeters allows a required value of the inductance L2 to be obtained; this required value of the inductance L2 is higher then a value of the inductance L1.

Note that, between a lead coupled to the source of a commercially available discreet vertical MOSFET package as the MOSFET 41H and a lead coupled to the drain of the MOSFET 41L, a parasitic inductance of the order of 10 nH as the inductance L1 of the first commutation path P1a is presented.

In this case, the branching point can be located at the lead to be connected to the source electrode of the commercially available discrete vertical MOSFET package or located close thereto. In addition, to the branching point, the anode of the second diode 43H can be joined through an inductance element of 40 to 60 nH.

The inductance element can be formed by a linear wire, a spiral wire, or a specific coil.

Because the branching point is arranged close to the lead of the source of the MOSFET package, it is possible to reduce the wiring inductance in the first commutation path P1a.

Figure 7:
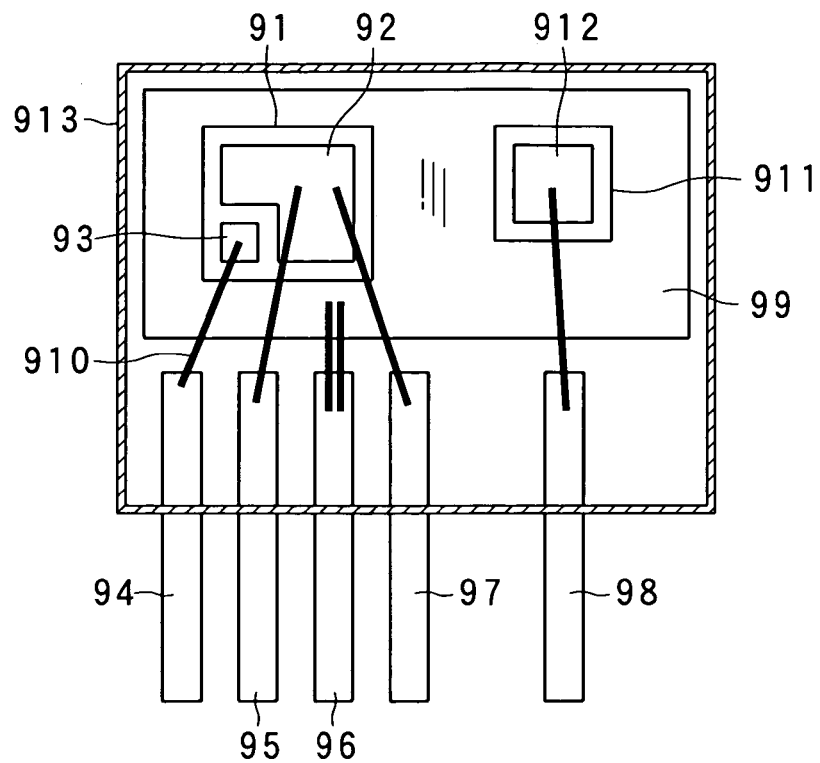
FIG. 7 is a partially cross-sectional view schematically illustrating the second packaging example of the high-side MOSFET integrated with the first commutation diode according to the embodiment.

FIG. 7 schematically illustrates the second packaging example of the MOSFET 41H. In the second packaging example, the MOSFET 41H is designed as a rectangular vertical MOSFET chip 91 with which a flywheel diode chip 911 serving the second diode 43H is integrated.

The source 92 and gate 93 are mounted on one surface of the vertical MOSFET chip 91, and the drain (not shown) is mounted on the other surface of the vertical MOSFET chip 91. Reference character 913 represents a package with five leads 94, 95, 96, 97, and 98 located at one side thereof. The package 913 encapsulates the vertical MOSFET chip 91 and the flywheel chip 911 with one ends of the five leads 94 to 98 projecting from the one side thereof.

Reference character 99 represents a common conductor, such as a common conductive substrate, 99 provided in the package 913. To the conductor 99, the drain of the MOSFET chip 91 and the cathode of the flywheel diode chip 911 serving as the second diode 43H are joined.

The source 92 is joined to the other ends of the leads 95 and 97 by bonding wires 910. The other end of the lead 94 is joined to the gate of the MOSFET chip 91 by a bonding wire 910, and the other end of the lead 96 is joined to the conductor 99 by bonding wires 910. The lead 98 is joined to the anode 912 of the flywheel diode chip 911 by a bonding wire 910.

In the second packaging example, a inductance element as the inductance 44H is connected between the lead 97 and the lead 98 within the package 913.

Because the second diode 43H is integrated in the common package 913 together with the MOSFET chip 91, a wiring inductance between the anode 912 of the second diode 43H and the lead 98 and that between the lead 97 and the source electrode 92 are unaffected by external environment. Thus, it is possible to easily determine with high accuracy, variations in the wiring inductance between the anode 912 of the second diode 43H and the lead 98 and those in the wiring inductance between the lead 97 and the source electrode 92. Variations in the inductance element 44H can be therefore reduced.

Figure 8:
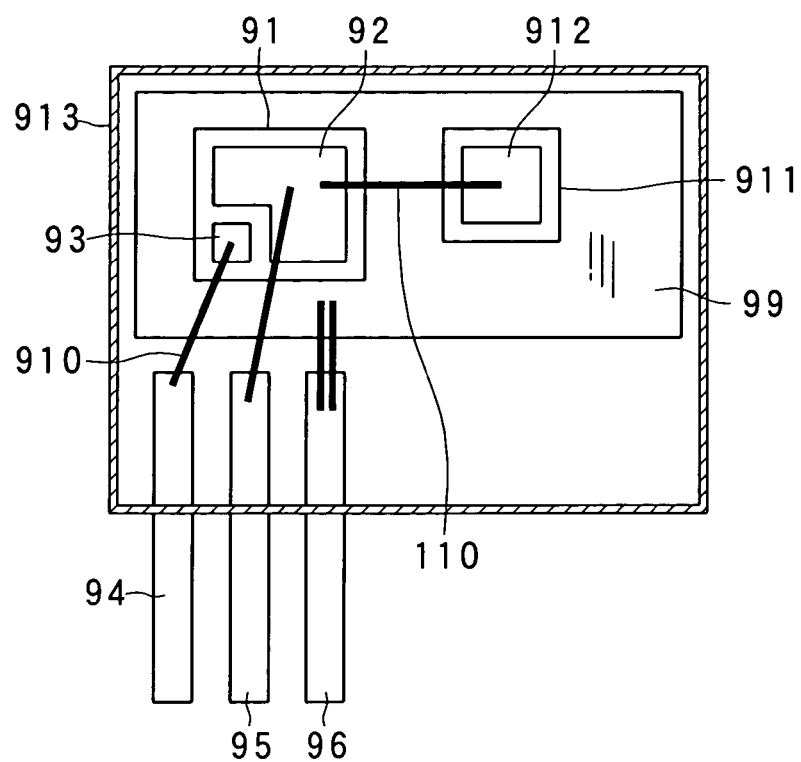
FIG. 8 is a partially cross-sectional view schematically illustrating the third packaging example of the high-side MOSFET integrated with the first commutation diode according to the embodiment.

FIG. 8 schematically illustrates the third package example of the MOSFET 41H. In the third packaging example, in the configuration of FIG. 7, a bonding wire 110 is provided in place of the leads 97 and 98. The bonding wire 110 is located to directly connect between the source 92 and the anode 912. In the third packaging example, the vertical MOSFET chip 91 serving as the MOSFET 41H and the flywheel diode chip 911 serving as the second diode 43H are integrated in the same package 913 so that the first and second commutation paths P1a and P2a are formed in the same package 913. This allows the inductances L1 and L2 to be precisely created because they are unaffected by external environment.

Figure 9:
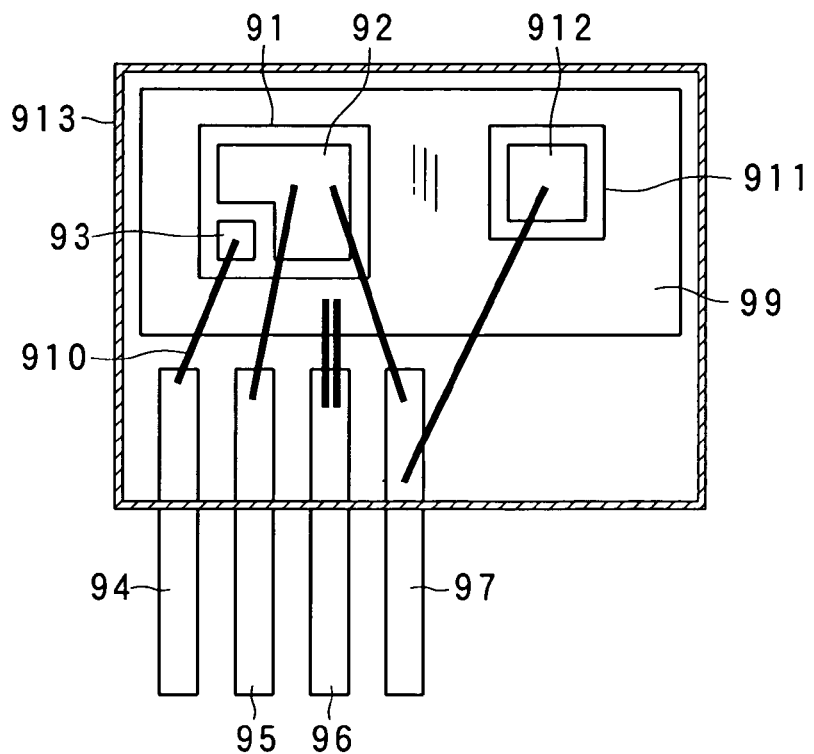
FIG. 9 is a partially cross-sectional view schematically illustrating the fourth packaging example of the high-side MOSFET integrated with the first commutation diode according to the embodiment.

FIG. 9 schematically illustrates the fourth packaging example of the MOSFET 41H. In the fourth packaging example, in the configuration of FIG. 7, a bonding wire 110 is provided in place of the lead 98. The bonding wire 110 is located to directly connect between the anode 912 and the other end of the lead 97. To the one end (projecting end) of the lead 97, no external elements are joined. The configuration allows the inductance 44h between the source 92 and the anode 912 to increase.

Figure 10:
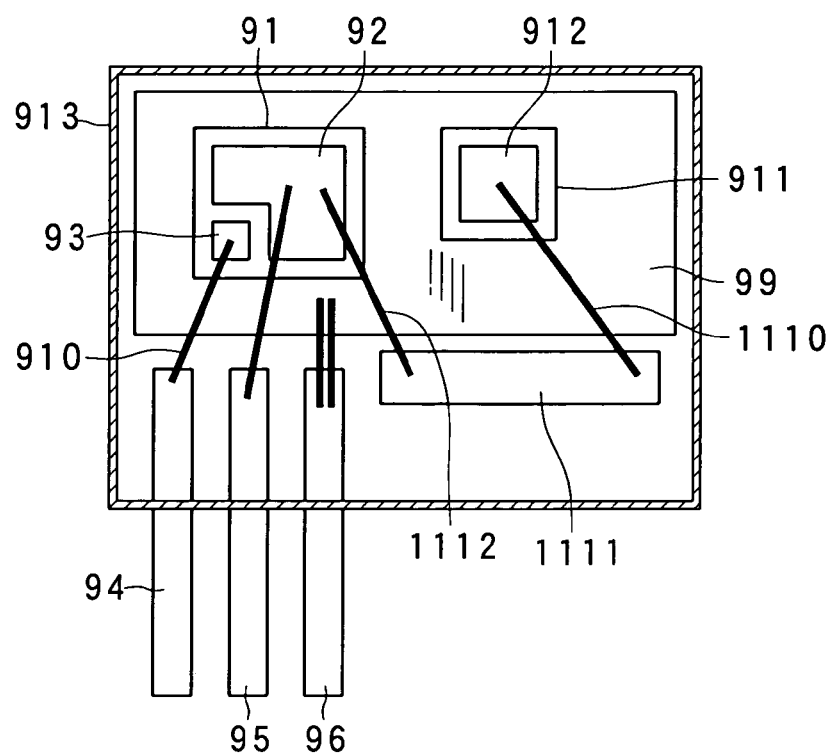
FIG. 10 is a partially cross-sectional view schematically illustrating the fifth packaging example of the high-side MOSFET integrated with the first commutation diode according to the embodiment.

FIG. 10 schematically illustrates the fifth packaging example of the MOSFET 41H. In the fifth packaging example, in the configuration of FIG. 9, a conductor 1111 is located adjacent to the conductor 99 and integrated in the package 913. To the conductor 1111, the source 92 of the vertical MOSFET chip 91 and the anode 912 of the flywheel diode chip 911 serving as the second diode 43H are joined.

This allows a value of the inductance 44H between the source 92 and the anode 912 through the bonding wire 1112, the conductor 1111, and the bonding wire 1110 to increase.

This configuration of the MOSFET 41H allows the source 92 of the MOSFET 41H, the anode 912 of the flywheel diode 911, the drain of the MOSFET 41L, and the inductive load 43 to be separated at the source 92 of the MOSFET 41H as the branching point thereamong. This allows the inductance in the first commutation path P1a with the first diode 42H (the intrinsic diode) to be set to a minimum value.

In addition, the vertical MOSFET chip 91 serving as the MOSFET 41H and the flywheel diode chip 911 serving as the second diode 43H are integrated in the same package 913 so that the first and second commutation paths P1a and P2a are formed in the same package 913. This allows the inductances L1 and L2 to be precisely created because they are unaffected by external environment.

Change of the shape of the conductor 1111 allows the value of the inductance L2 and the value of the resistance r2 to be easily adjusted with high accuracy.

Figure 11:
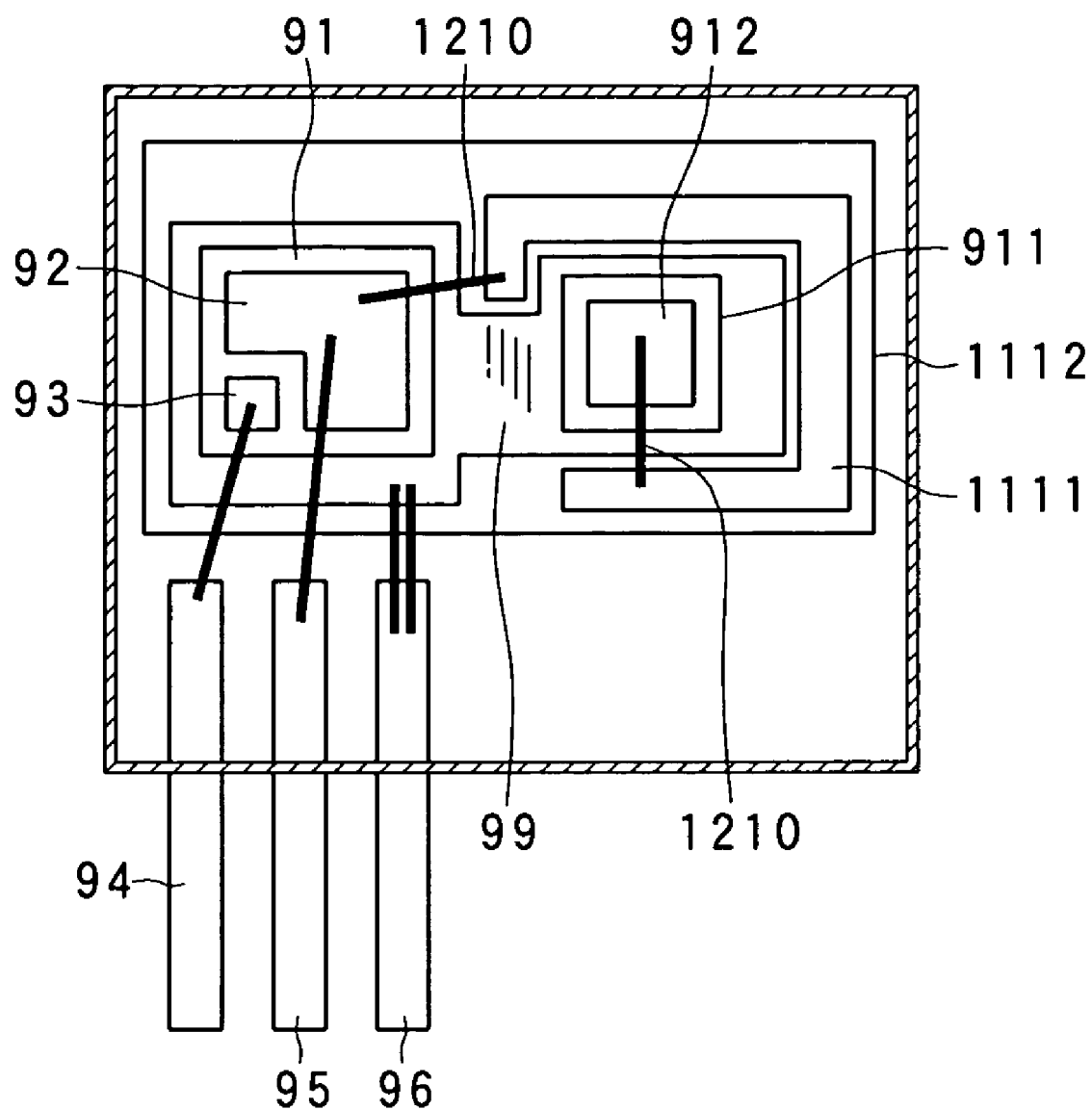
FIG. 11 is a partially cross-sectional view schematically illustrating the sixth packaging example of the high-side MOSFET integrated with the first commutation diode according to the embodiment.

FIG. 11 schematically illustrates the sixth packaging example of the MOSFET 41H. In the sixth packaging example, in the configuration of FIG. 10, the conductor 99 and the conductor 1111 are mounted on an insulated substrate 1112, and the conductor 1111 is located to extend around three sides and a part of the remaining side of the flywheel diode chip 911.

One end and the other end of the conductor 1111 in its longitudinal (extending) direction are joined to the anode 912 and the source 92 by bonding wires 1210 and 1210, respectively. That is, the conductor 1111 for connecting between the source 92 and the anode 912 is designed to sufficiently extend. This achieves an effect of increasing the inductance 44H between the source 92 and the anode 912 with a compact structure.

In each of the first to sixth packaging examples, the MOSFET 41H and the second diode 43H are independently formed by separated chips, but can be integrated with each other in a common chip. In this first modification, the source of the MOSFET 41H and the anode of the second diode 43H are preferred to be separately formed. On the common chip, an inductance element as the inductance 44H can be mounted.

In each of the first to sixth packaging examples, a wiring inductance 44H or an inductance element 44H is arranged between the source of the vertical MOSFET 91 and the anode of the second diode 43H, but can be arranged between the drain of the vertical MOSFET 91 and the cathode of the second diode 43H. Specifically, the inductance L2 consists of the inductance of all of the first commutation path P1a between the branching point at the source side of the vertical MOSFET 91 and the branching point at the drain side thereof.

In each of the first to sixth package examples, the reverse recovery current through the first diode 42H of the vertical MOSFET 91 is reduced, but the present invention in not limited thereto.

Specifically, the second commutation path can be used to reduce a reverse recovery current through any one of various power semiconductor switching elements each having minor carrier charging effect that is the same as the vertical MOSFET chip 91. The various power semiconductor switching elements include DMOSFETs with a high threshold voltage and MOSFETs each with a super junction structure (SJ). Note that, when a MOSFET with a super junction structure is used as the vertical MOSFET chip 91 (MOSFET 41H), because the rate of change in the reverse recovery current is high, it is preferable to reduce the resistance r2 of the second commutation circuit to thereby increase the rate of change in the flywheel current i2.

Figure 12:
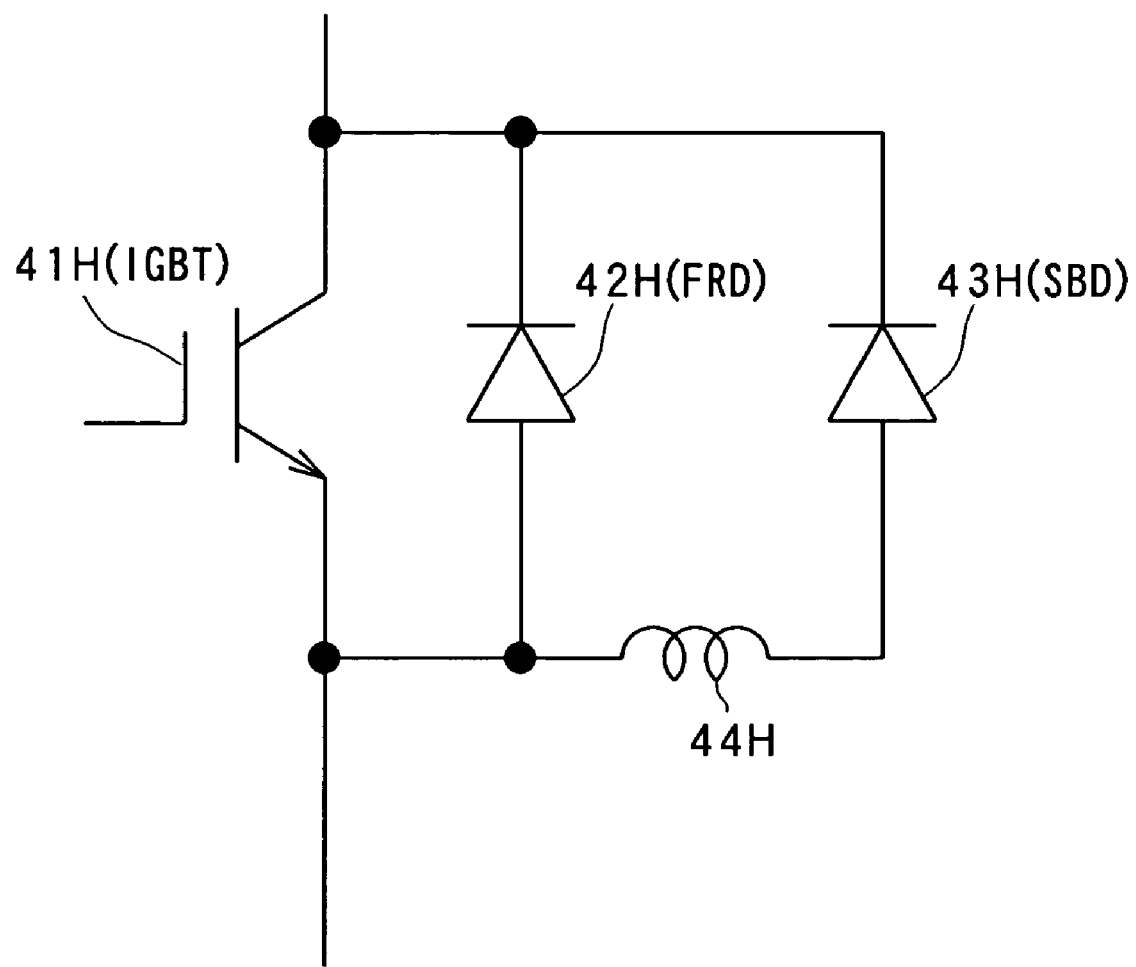
FIG. 12 is a circuit diagram of a modification of an upper arm switch illustrated in FIG. 1.

In addition, as illustrated in FIG. 12, when an IGBT is used as the vertical MOSFET chip 91 (MOSFET 41H) and a fast recovery diode is used as the first diode 42H and connected in antiparallel to the IGBT, a set of series-connected second diode (Schottky barrier diode) 43H and an inductance element 44H can be connected in parallel to the first diode 42H. This can reduce an adverse effect of the reverse recovery current through the first diode 42H like the embodiment.

In the embodiment and each of the first to sixth packaging examples, the present invention is applied to the power switching circuit 1 consisting of one half-bridge module 5, but the present invention is not limited thereto.

Specifically, the present invention can be applied to inverters, DC to DC converters, and the like. For example, an inverter to which the present invention is applied consists of a plurality of half-bridge modules 5 for, for example, a plurality of multiphase windings. Such an inverter works to individually driving on and off the high-side switch (MOSFET) 41H and the low-side switch (MOSFET) 41L of each of the half-bridge modules 5 to thereby convert the DC voltage across the DC battery 46 to an AC (Alternating Current) voltage to be applied to each of the multiphase windings.

FIG. 13 schematically illustrates the first to third graphs:

the first graph G1 demonstrates the waveform of an actually measured current that rises when the MOSFET 41L is ON in the power switching circuit 1 according to the embodiment;

the second graph G2 demonstrates the waveform of an actually measured current that rises when the MOSFET 41L is ON in a first comparative power switching circuit in which no inductance 44H is provided in the second commutation path P2*a* (the second diode 43H is only provided therein) in the structure of the power switching circuit 1; and the third graph G3 demonstrates the waveform of an actually measured current that rises when the MOSFET 41L is ON in a second comparative power switching circuit in which no second commutation path P2*a* is provided in the structure of the power switching circuit 1.

FIG. 13 clearly illustrates that the inductance 44H provided in the second commutation path P2*a* allows the reverse recover current through the low-side switch (MOSFET 41L) to be effectively reduced.

While there has been described what is at present considered to be the embodiment and its modifications of the present invention, it will be understood that various modifications which are not described yet may be made therein, and it is intended to cover in the appended claims all such modifications as fall within the true spirit and scope of the invention.

What is claimed is:

1. A power switching circuit comprising:

a semiconductor switching element having a first terminal electrically connected to a power supply source and having a second terminal electrically connected to an inductive load, the power semiconductor switching element being configured to be switched on and off;

a first commutation member having a first commutation path and a first diode provided in the first commutation path, the first commutation path being electrically connected across the semiconductor switching element, the first diode being electrically connected antiparallel to the semiconductor switching element, while the semiconductor switching element is off, the first commutation path allowing a first current based on the inductive load to flow therethrough in a forward direction of the first diode within a commutation period; and a second commutation member having a second commutation path and a second diode provided in the second commutation path, the second commutation path being electrically connected in parallel to the first commutation path, the second diode being electrically connected antiparallel to the semiconductor switching element, while the semiconductor switching element is off, the second commutation path allowing a second current based on the inductive load to flow therethrough in a forward direction of the second diode within the commutation period, the first diode having a first reverse recovery time, the second diode having a second reverse recovery time, the second reverse recovery time being shorter than the first reverse recover time, the first commutation path having a first inductance, the second commutation path having a second inductance, the second inductance being higher than the first inductance.

2. The power switching circuit according to claim 1, wherein:

a reverse recovery current flows through the first commutation path in a reverse direction of the first diode within a reverse period after the commutation period has elapsed so that the first current becomes zero, and an average value of a de-energizing current flowing through the second commutation path in the forward direction of the second diode over the reverse period based on an electromagnetic energy of the second inductance is set to be equal to an average value of the reverse recovery current over the reverse period, the electromagnetic energy being charged in the second inductance by the second current within the commutation period.

3. The power switching circuit according to claim 1, wherein the second inductance in the second commutation path is set to be substantially two to eight times greater than the first inductance in the first commutation path.

4. The power switching circuit according to claim 1, wherein the second inductance in the second commutation path is set to be substantially four to six times greater than the first inductance in the first commutation path.

5. The power switching circuit according to claim 1, wherein the second commutation path includes wiring inductance, and the wiring inductance serves as the second inductance.

6. The power switching circuit according to claim 1, wherein the first commutation path has a first length, the second commutation path has a second length, the second length being formed to be longer than the first length.

7. The power switching circuit according to claim 6, wherein the semiconductor switching element, the first diode, and the second diode are integrally mounted on a common substrate to be contained in a common package, and at least one end of the first commutation path and a corresponding at least one end of the second commutation path are connected to each other at a connecting point, the connecting point being contained in the common package.

8. The power switching circuit according to claim 6, wherein the semiconductor switching element and the first diode are mounted on a common semiconductor chip, the second diode being formed in an alternative semiconductor chip different from the common semiconductor chip, the alternative semiconductor chip being contained in a common package together with the common semiconductor chip.

9. The power switching circuit according to claim 6, wherein the semiconductor switching element, the first diode, and the second diode are integrated in a common semiconductor chip.

10. The power switching circuit according to claim 1, wherein the semiconductor switching element is a MOSFET with an intrinsic diode as the first diode, the MOSFET is integrated in a semiconductor chip, at least one end of the first commutation path and a corresponding at least one end of the second commutation path are connected to each other at a connecting point, and an electrode is formed on the semiconductor chip, the connecting point being mounted on the electrode formed on the semiconductor chip.

11. The power switching circuit according to claim 1, wherein an integrated value of the reverse recovery current over the reverse period and an integrated value of the de-energizing current over the reverse period are set to be substantially equal to each other.

12. The power switching circuit according to claim 1, wherein the first diode is a junction diode, and the second diode is a Schottky diode.

13. The power switching circuit according to claim 1, wherein the first diode is a junction diode, and the second diode is a fast recovery diode.

14. The power switching circuit according to claim 1, wherein the first diode is a fast recovery diode, and the second diode is a Schottky diode.

15. The power switching circuit according to claim 1, wherein the semiconductor switching element is a MOSFET with a super junction structure and with an intrinsic diode, the intrinsic diode serving as the first diode.

16. The power switching circuit according to claim 1, wherein the semiconductor switching element and the first diode are integrated in a common package, the common package being provided with a plurality of terminals, the plurality of terminals including at least one of the first terminal and the second terminal, and the second diode is joined to a part of at least one of the plurality of terminals by a wire.

* * * * *